United States Patent [19]

Seki et al.

[11] Patent Number: 4,571,510

[45] Date of Patent: Feb. 18, 1986

[54] DECODER CIRCUIT

[75] Inventors: Teruo Seki; Takahiko Yamauchi, both of Kawasaki; Keizo Aoyama, Yamato, all of Japan

[73] Assignee: Fujitsu Limited, Kawasaki, Japan

[21] Appl. No.: 535,831

[22] Filed: Sep. 26, 1983

[30] Foreign Application Priority Data

Sep. 29, 1982 [JP] Japan .................. 57-168273

[51] Int. Cl.$^4$ ............. H03K 19/20; H03K 19/017; H03K 19/096; G11C 8/00
[52] U.S. Cl. .................... 307/449; 307/443; 307/463
[58] Field of Search .......... 307/449, 453, 463, 481, 307/443, 270; 365/230

[56] References Cited

U.S. PATENT DOCUMENTS

| 3,651,342 | 3/1972 | Dingwall | 307/451 X |
|---|---|---|---|
| 3,766,408 | 10/1973 | Suzuki et al. | 377/121 X |
| 4,024,512 | 5/1977 | Amelio et al. | 307/463 X |
| 4,247,921 | 1/1981 | Itoh et al. | 307/463 X |
| 4,258,272 | 3/1981 | Huang | 307/475 |
| 4,267,464 | 5/1981 | Takemae et al. | 307/463 |
| 4,398,102 | 8/1983 | Stewart | 307/449 |
| 4,404,474 | 9/1983 | Dingwall | 307/449 X |
| 4,455,629 | 6/1984 | Suzuki et al. | 307/449 X |

FOREIGN PATENT DOCUMENTS

| 2417972 | 10/1975 | Fed. Rep. of Germany | 307/449 |
|---|---|---|---|
| 22238 | 2/1980 | Japan | 365/230 |
| 41579 | 4/1981 | Japan | 307/449 |

OTHER PUBLICATIONS

Schlageter et al., "Two 4K Static 5-VRAM's"; *IEEE-JSSC*, vol. SC-11, No. 5, pp. 602-608; 10/1976.
Schuster, "On-Chip Redundancy Scheme"; *IBM Tech. Discl. Bull.;* vol. 14, No. 5, pp. 1513-1514; 10/1971.
Pashley et al., "A 16K×1B Static RAM"; *IEEE ISSCC'79-2/15/79, Digest of Technical Papers.*
IEEE Journal of Solid-State Circuits, "2K×8 Bit Hi-CMOS Static RAM's", Osamu Minato et al., vol. SC-15, No. 4, Aug. 1980, pp. 656-660.

*Primary Examiner*—Larry N. Anagnos
*Attorney, Agent, or Firm*—Staas & Halsey

[57] ABSTRACT

A decoder circuit receives decoder inputs and producing decoder outputs. The decoder inputs are applied, as control inputs, to respective input transistors connected in parallel with each other. The outputs thereof are commonly connected to a node. The node is connected to a gate transistor and latch transistors. The gate transistor is operative to invert the level at the node momentarily every time the decoder circuit is switched from a nonselection state to a selection state. The latch transistors maintain the level at the node as the decoder output level.

8 Claims, 13 Drawing Figures

DECODER CIRCUIT

BACKGROUND OF THE INVENTION

(1) Field of the Invention

The present invention relates to a decoder circuit, more particularly to a decoder circuit preferably applied to a memory address decoder circuit fabricated in the form of a complementary metal oxide semiconductor (C-MOS).

(2) Description of the Prior Art

As is well known, decoder circuits generally function to decode one digital signal and to transform it into another digital signal. In a semiconductor memory, decoder circuits decode memory addresses for selecting a desired word line and bit line to obtain access to the specific memory cell at the cross point therebetween. That is, in a semiconductor memory, decoder circuits are used as word decoder circuits and column decoder (bit decoder) circuits.

In recent years, various new types of semiconductor memories have been proposed. Along with the advances made in semiconductor memories, various new types of word decoder and column decoder circuits having smaller size, higher density packaging, or higher operation speeds have been proposed.

Up until now, however, it has not been possible to achieve all three of these features in a decoder circuit simultaneously.

SUMMARY OF THE INVENTION

It is an object of the present invention to provide a decoder circuit which can achieve smaller size, higher density packaging, and higher operation speeds simultaneously.

The above object is attained by eliminating most of the series-connected transistors from the prior art decoder circuits. The series-connected transistors are replaced by a gate transistor and a transistor latch. The gate transistor functions to immediately invert a level at a certain node by a gate pulse, generated at every change of a decoder input, when the decoder input changes to one specifying a selection state. The transistor latch holds the level at the node as it is until the next change of the decoder input.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Figure 1:
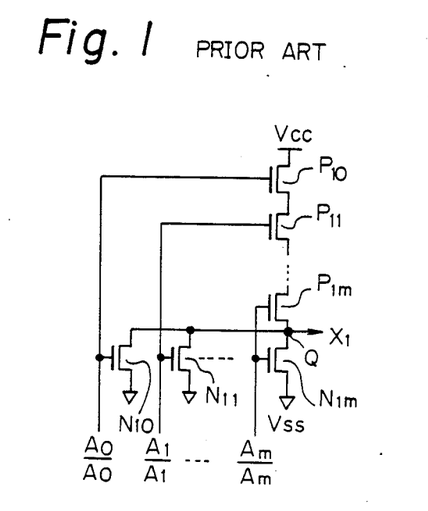
FIG. 1 is a circuit diagram of a first example of a prior art decoder circuit.

FIG. 1 is a circuit diagram of a first example of a prior art decoder circuit. This type of decoder circuit is comprised of a plurality of input transistors and a plurality of series transistors. The input transistors receive, as control inputs, decoder inputs $A_0$, $\overline{A}_0$, $A_1$, $\overline{A}_1$, ... $A_m$, $\overline{A}_m$ (hereinafter referred to, as a whole, as $A_{in}$ for brevity) and are connected in parallel with each other. The series transistors also receive, as control inputs, decoder inputs $A_{in}$, but are connected in series with each other. Thus, a decoder output $X_1$ is obtained at a node Q connected in common to each output of the parallelly connected input transistors. In this arrangement, the input transistors are composed of N-channel transistors $N_{10}$, $N_{11}$ ... $N_{1m}$, while the series transistors are composed of P-channel transistors $P_{10}$, $P_{11}$ ... $P_{1m}$. The decoder inputs $A_{in}$ are expressed as a combination of ($A_0$ or $\overline{A}_0$), ($A_1$ or $\overline{A}_1$) ... ($A_m$, $\overline{A}_m$). If the inputs $A_{in}$ are all of logic L (low), the input transistors are all turned off, while the series transistors are all turned on. Thus, an "H" (high) level signal appears at the node Q. The decoder output $X_1$ is thereby changed to the "H" level so that a corresponding word line (not shown) receiving the "H" level output $X_1$ is selected. As seen from the above, the decoder circuit has a C-MOS structure.

The decoder circuit of FIG. 1 suffers from the problem that it requires twice the number of transistors (P-channel transistors and N-channel transistors) than the number (m+1) of bits of the decoder inputs $A_{in}$. This impedes size reduction and high density packaging.

Also, the decoder circuit cannot achieve high speed operation due to the many series transistors ($P_{10}$, $P_{11}$ ... $P_{1m}$). The reason for this is, in brief, that a parasitic capacitor exists in each of the series-connected transistors. Assume the P-channel transistors $P_{10}$, $P_{11}$ ... $P_{1m}$ have all been off and are now all to be switched on so as to change the level at the node Q from "L" to "H". In actuality, however, the node Q is not changed to the "H" level as quickly as intended until the parasitic capacitors, inherent to each P-channel transistor, are sufficiently charged sequentially from $P_{10}$ to $P_{1m}$. Another reason for this is, in brief, that the effective conductance $g_m$ of the series-connected transistors is reduced. That is, assuming each of these series-connected transistors provides $g_{mo}$, as the conductance $g_m$, the effective conductance $g_m$ of the n series-connected transistors is reduced almost to $g_{mo}/n$.

Figure 2:
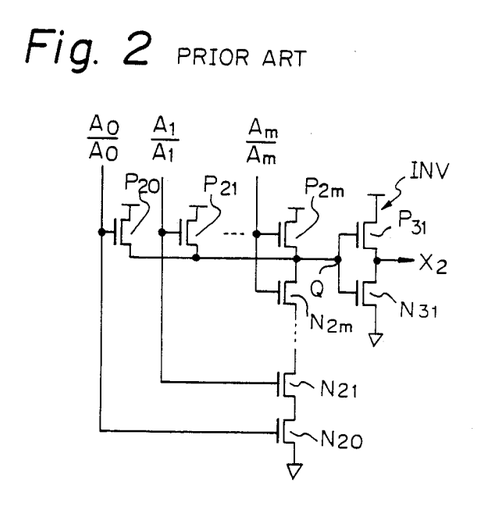
FIG. 2 is a circuit diagram of a second example of a prior art decoder circuit.
Figure 3:
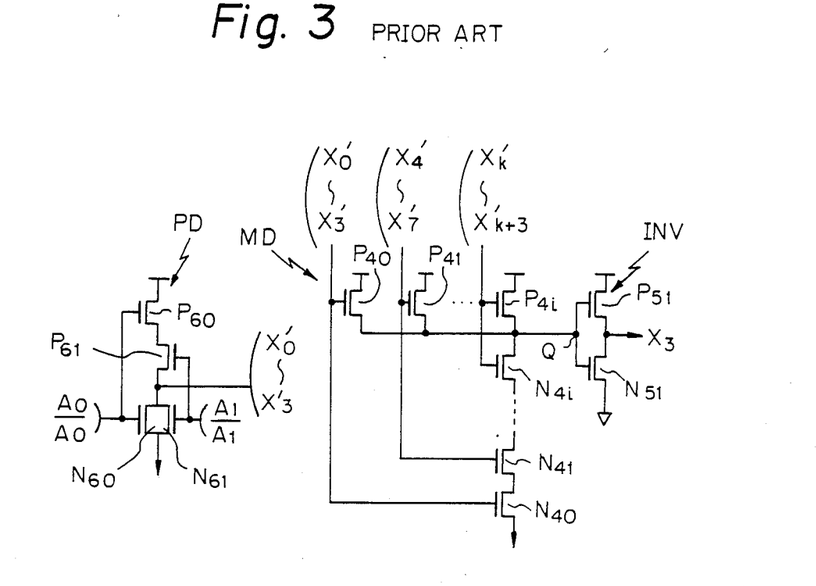
FIG. 3 is a circuit diagram of a third example of a prior art decoder circuit.

FIG. 2 is a circuit diagram of a second example of a prior art decoder circuit. The prior art decoder circuit, disclosed in, for example "2k×8 bit Hi-CMOS Static RAS's", IEEE J. Solid State Circuit, vol. sc-15 No. 4, P. 659, FIG. 8, is identical to that of FIG. 1, but has an inverted conductivity type of the channel of each corresponding transistor. The second example of the decoder circuit also has a C-MOS structure. In FIGS. 1 through 3, identical members are represented by the same reference characters (the same is true for later figures). Since the level at the node Q is opposite to that of the first type decoder circuit, an inverter INV, comprised of a P-channel transistor $P_{31}$ and an N-channel transistor $N_{31}$, is needed to obtain a decoder output $X_2$ of a desired level. This second type of decoder circuit suffers from the same size reduction and packaging density problem and operation speed problem as the first type.

FIG. 3 is a circuit diagram of a third example of a prior art decoder circuit. This type of decoder circuit is basically comprised of pre-decoder circuits PD (only one is illustrated for simplicity) and a main-decoder circuit MD. Pre-decoded outputs $X'_0 \ldots X'_3$ (same for other pre-decoded outputs $X'_4 \ldots X'_7, \ldots X'_k \ldots X'_{k+3}$) are first applied to the main-decoder circuit MD as decoder inputs therefor. Thus, a decoder output $X_3$ is produced. As diagrammed, the pre-decoder circuit PD is comprised of P-channel transistors $P_{60}$, $P_{61}$ and N-channel transistors $N_{60}$ and $N_{61}$; while the main-decoder circuit MD is comprised of P-channel input transistors $P_{40}$ and $P_{41}, \ldots P_{4i}$ and N-channel series transistors $N_{40}$, $N_{41} \ldots N_{4i}$. The main-decoder circuit MD is further provided with an inverter INV comprised of a P-channel transistor $P_{51}$ and an N-channel transistor $N_{51}$. Therefore, the decoder circuit is similar to the second type.

This third type of decoder circuit can overcome the problem of size reduction and packaging density, since the total number of the transistors is roughly halved. It still, however, suffers from the problem of operational speed due to the inevitable delay time when the inputs pass through the pre-decoder circuits PD.

Figure 4:
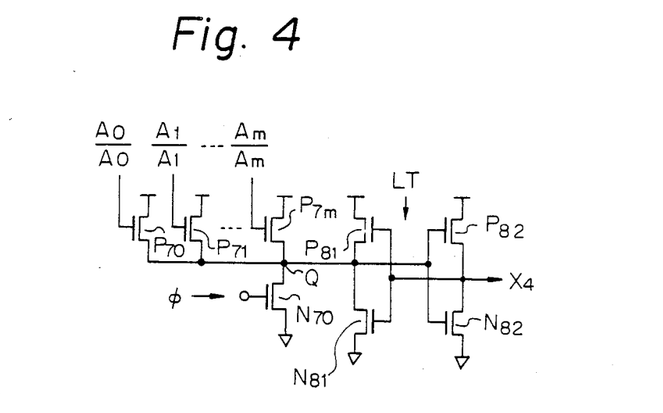
FIG. 4 is a circuit diagram of a decoder circuit according to a first embodiment of the present invention.

FIG. 4 is a circuit diagram of a decoder circuit according to a first embodiment of the present invention. In FIG. 4, input transistors receiving, as control inputs, the decoder inputs $A_0, \overline{A}_0, A_1, \overline{A}_1 \ldots A_m, \overline{A}_m$ ($A_{in}$) are composed of P-channel transistors $P_{70}, P_{71} \ldots P_{7m}$, which are connected in parallel with each other. The input transistors correspond to the input transistors ($P_{20}, P_{21} \ldots P_{2m}$) of FIG. 2. Each output of these input transistors is connected in parallel with respect to a node Q. Further, P-channel transistors $P_{81}$ and $P_{82}$ and N-channel transistors NHd 81 and $N_{82}$ together form a transistor latch LT.

It is important to note here that the series transistors shown in FIGS. 1 through 3 are removed from the circuit of FIG. 4 and replaced with a new gate transistor (N-channel) $N_{70}$. In addition, the transistor latch LT is also newly employed. The elimination of the series transistors enables realization of size reduction, higher density packaging, and higher speed operation speed.

Figure 5:
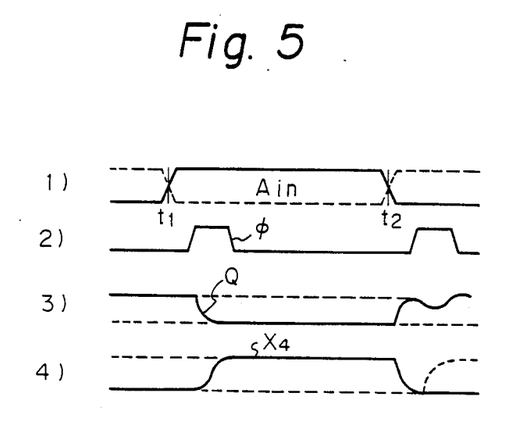
FIG. 5 is a diagram of waveforms at major portions in FIG. 4 for explaining the operation of the circuit shown therein.

The operation of the device in the first embodiment of the present invention will be clarified below with reference to FIG. 5. FIG. 5 depicts waveforms at major portions in FIG. 4. First, before the time $t_1$ (refer to row 1) of FIG. 5), the decoder inputs $A_{in}$ are left as they are, and the decoder circuit is regarded to be, for example, in a nonselection state. In FIG. 5, the nonselection state and selection state are differentiated by broken lines and solid lines, respectively.

In the nonselection state, at least one of the decoder inputs $A_{in}$ should necessarily be a logic level of "L". Accordingly, the "H" level necessarily appears at the node Q. Due to the "H" level at the node Q, the transistor $N_{82}$ is turned on (the transistor $P_{82}$ is off), and thereby the decoder output $X_4$ of the "L" level is obtained. This "L" level is fed back to each gate of the transistors $P_{81}$ and $N_{81}$. Accordingly, the transistor $P_{81}$ is maintained on (transistor $N_{81}$ is off). As a result, a so called latch state is established. That is, the transistor latch LT stably maintains the decoder output $X_4$ at the "L" level.

After the time $t_1$, suppose that the decoder input $A_{in}$ is then changed and thus the related decoder circuit is selected. In this case, at the time $t_1$, all the decoder inputs $A_{in}$ start changing to "H" levels. Just at that moment, a gate pulse $\phi$ is set at the "H" level for a short period. The gate pulse $\phi$ of the "H" level is applied to the gate transistor $N_{70}$ at its gate, thereby turning on the transistor $N_{70}$. At this moment, the level at the node Q is momentarily inverted from "H" to "L". It should be understood here that a deleterious power short cannot occur via the conductive gate transistor $N_{70}$, since the input transistors $P_{70}, P_{71} \ldots P_{7m}$ are now all maintained off.

Thus, due to the "L" level at the node Q, the transistor $P_{82}$ is turned on (transistor $N_{82}$ is off) and the decoder output $X_4$ of the "H" level is produced. In this state, the "H" level of the decoder output $X_4$ is fed back to each gate of the transistors $P_{81}$ and $N_{81}$, and, accordingly, the transistor $N_{81}$ is maintained on (transistor $P_{81}$ is off). As a result, a latch state is established. That is, the transistor latch LT stably maintains the decoder output $X_4$ at the "H" level.

Assuming that the decoder input $A_{in}$ is then changed again at the time $t_2$, the decoder circuit is switched from the selection state to the nonselection state. In this state, at least one of the input transistors should necessarily be turned on, since at least one bit of the decoder inputs $A_{in}$ should necessarily be at the "L" level so that the level at the node Q is changed from "L" to "H". On the other hand, the gate pulse $\phi$ turns on the gate transistor $N_{70}$ for a short period, since the gate pulse $\phi$ is produced every time a change of the decoder inputs $A_{in}$ occurs. Due to the conductive gate transistor $N_{70}$, the level at the node Q momentarily falls to "L". However, since the gate pulse $\phi$ soon changes to the "L" level, the level at the node Q soon returns to "H" again. The thus restored "H" level state is equivalent to the state established before the time $t_1$, and thereby, the "L" level of the decoder output $X_4$ is stably maintained by means of the transistor latch LT.

During the term where the pulse $\phi$ is "H", the transistor $N_{70}$ is on, while at least one of the transistors $P_{70}$ through $P_{7m}$ of the remaining nonselected decoders is also on. Therefore, at this time, the level at the node Q is determined by a ratio between the $g_m$ of the transistor $N_{70}$, now on, and the $g_m$ of at least one of the transistors $P_{70}$ through $P_{7m}$, now on. In actuality, the sizes of these transistors are so designed, in advance, as to prevent the decrease of the thus determined level at the node Q. Such design can also maintain the level substantially high at the node Q of each nonselected decoder.

Figure 6:
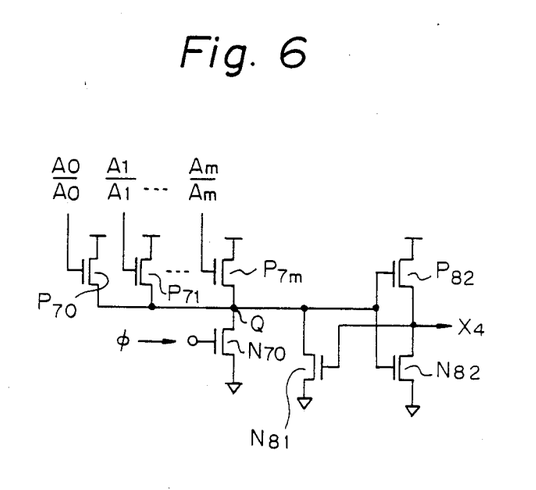
FIG. 6 is a circuit diagram of a decoder circuit according to a modified first embodiment of the present invention.

FIG. 6 is a circuit diagram of a decoder circuit according to a modified first embodiment of the present invention. In the modified embodiment of FIG. 6, the transistor $P_{81}$ of FIG. 4 is not used. The transistor $P_{81}$ may be omitted from the circuit arrangement of FIG. 4, since, when the decoder output $X_4$ is at the "H" level, only the transistor $N_{81}$ is on and, at the same time, the transistor $P_{81}$, now off, is not electrically effective. On the other hand, when the decoder output $X_4$ is at the "L" level, i.e., the decoder circuit is in the nonselection state, at least one of the transistors $P_{70}, P_{71} \ldots P_{7m}$ is turned on, and, therefore, the at least one conductive transistor can substitute for the transistor $P_{81}$, now on. However, there is an advantage to using the transistor $P_{81}$ in that it provides a noise-proof ability.

Figure 7:
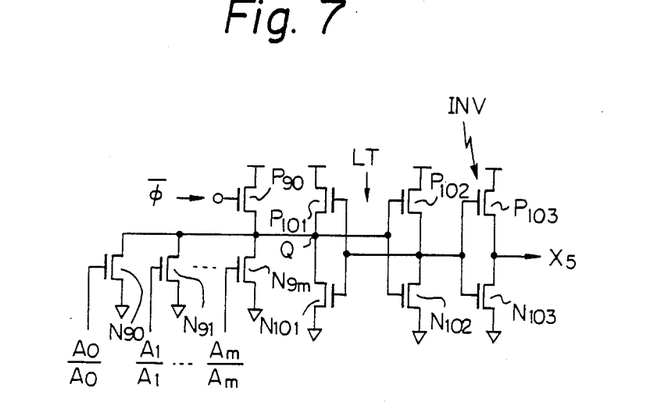
FIG. 7 is a circuit diagram of a decoder circuit according to a second embodiment of the present invention.

FIG. 7 is a circuit diagram of a decoder circuit according to a second embodiment of the present invention. The circuit structure of the second embodiment is equivalent to that of the first embodiment, but the conductivity type of each transistor is reversed. That is, a gate pulse $\bar{\phi}$ is used, instead of $\phi$, and the gate transistor is composed of a P-channel transistor $P_{90}$, instead of $N_{70}$. Further, the input transistors are composed of N-channel transistors $N_{90}, N_{91}, \ldots N_{9m}$, instead of $P_{70}, P_{71} \ldots P_{7m}$, and, therefore, each level of the decoder inputs $A_{in}$ of the second embodiment is given as an inverted logic of the decoder inputs used in the first embodiment. Furthermore, the transistor latch LT is composed of P-channel transistors $P_{101}$ and $P_{102}$ and N-channel transistors $N_{101}$ and $N_{102}$, which are opposite in conductivity to those used in the first embodiment.

In this case, however, an inverter INV, comprised of a P-channel transistor $P_{103}$ and N-channel transistor $N_{103}$, must be employed, because the level at the node Q is also opposite to that produced in the first embodiment. That is, the level of the output from the transistor latch LT must be inverted by means of the inverter INV so as to obtain a decoder output $X_5$ having predetermined levels, i.e., "H" in the selection state and "L" in the nonselection state.

Figure 8:
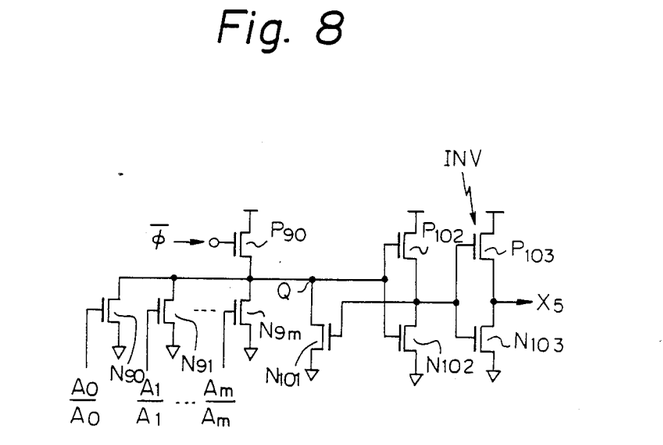
FIG. 8 is a circuit diagram of a decoder circuit according to a modified second embodiment of the present invention.

The P-channel transistor $P_{101}$ can be removed from the circuit of FIG. 7, as previously stated regarding the transistor $P_{81}$ in the first embodiment, if no noise-proof ability is required, as diagrammed in FIG. 8.

In any of the above-mentioned embodiments, it is necessary to use a gate pulse $\phi$ ($\bar{\phi}$) generated every time a change of the decoder input $A_{in}$ occurs. In other words, an address change detecting circuit must be used with the decoder circuit of the present invention. The address change detecting circuit functions to detect level changes, i.e., "H"⇌"L", occurring in any one or more bits of the decoder inputs $A_{in}$ and is realized by utilizing a known similar circuit.

Figure 9A:
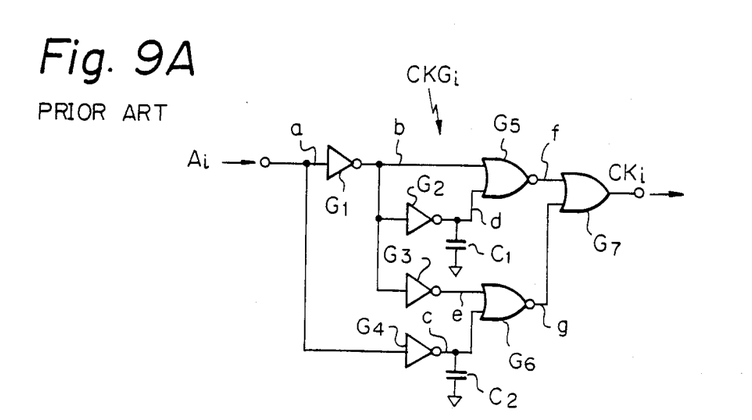
FIGS. 9A and 9B are circuit diagrams of a prior art gate pulse generator.
Figure 9B:
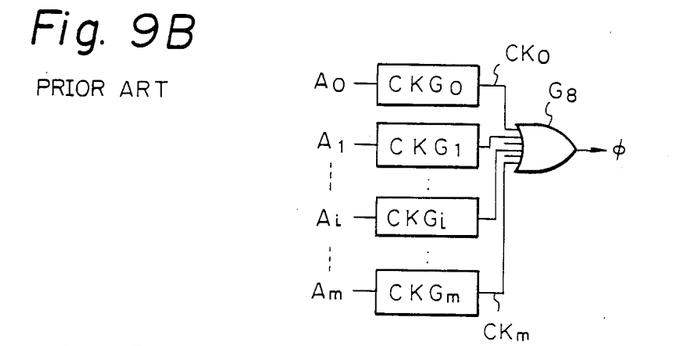

FIGS. 9A and 9B are circuit diagrams representing an example for realizing a gate pulse generator. The gate pulse generator is equivalent to the above-mentioned address change detecting circuit.

Figure 9C:
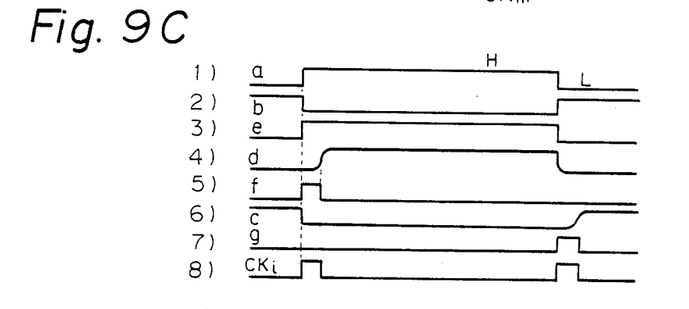
FIG. 9C is a waveform diagram of signals for explaining the operation of the circuit represented in FIGS. 9A and 9B.

FIG. 9C depicts waveforms of signals for explaining the operation of the circuit represented in FIGS. 9A and 9B.

In FIG. 9A, the reference characters $G_1$ through $G_4$ denote inverters, $G_5$ and $G_6$ NOR gates, and $G_7$ an OR gate. These members $G_1$ through $G_7$ are arranged, as diagrammed. The thus arranged gate pulse generator $CKG_i$ receives a bit input $A_i$ of the decoder inputs $A_{in}$ and then produces a corresponding clock pulse $CK_i$. The gate pulse generator $CKG_i$ of FIG. 9A is allotted for the corresponding bit $A_i$ of the inputs $A_{in}$. Identical gate pulse generators $CKG_0, CKG_1 \ldots CKG_m$ are allotted for bits $A_0, A_1 \ldots A_m$ of the inputs $A_{in}$. The clock pulses $CK_0$ through $CK_m$ from generators $CKG_1$ through $CKG_m$ are ORed by means of an OR gate $G_8$, as diagrammed in FIG. 9B.

With reference to FIGS. 9A through 9C, when the bit $A_i$ of the inputs $A_{in}$ changes from the "L" level to "H" level as shown by a signal a in row (1) of FIG. 9C, the output from the inverter $G_1$ changes as shown by a signal b in row (2) thereof. (Signals a through g and $CK_i$ in FIG. 9C correspond to those shown in FIGS. 9A and 9B.) The output from the inverter $G_2$, receiving the signal b, is an output d (refer to row 4) of FIG. 9C) which is inverted in level and, simultaneously, delayed in time with respect to the signal b by means of a capacitor $C_1$. As a result, the output f (refer to row 5) of FIG. 9C) is produced from the NOR gate $G_5$, which is the clock pulse $CK_i$ to be generated at the leading edge of the related bit $A_i$.

The inverters $G_3, G_4$, a capacitor $C_2$, and the NOR gate $G_6$ operate in an identical manner to the operation mentioned above, however, the resultant output g (refer to row 7) of FIG. 9C) therefrom is generated at not the leading edge of the bit $A_i$ but the tailing edge thereof.

These outputs f and g are ORed by means of the OR gate $G_7$, thus producing the clock pulse $CK_i$, which is a pulse obtained every time a bit change of $A_i$ occurs. Accordingly, the output from the OR gate $G_8$, ORing all the pulses $CK_0$ through $CK_m$, forms the intended gate pulse $\phi$, i.e., the gate pulse to be generated every time bit changes occur in any one or more bits of the decoder inputs $A_{in}$.

In the embodiments of FIGS. 4, 6, 7, and 8, the gate transistor $N_{70}$ or $P_{90}$ is mounted to each of the word lines. Further, all the gate transistors in the same memory circuit are turned on simultaneously every time the decoder input change takes place, in which DC paths are unintentionally formed between a power source and a ground via respective conductive gate transistors. Although such DC paths are created during a very short term, i.e., the pulse width of the gate pulse ($\phi, \bar{\phi}$), this is not totally preferable in view of power consumption.

If a design requires that the number of the DC paths be as small as possible, a suitable gate may be added in series with each gate transistor, and is opened only when the desired word line is selected. For example, a semiconductor memory area is usually divided into a plurality of memory blocks. In this case, the gate is opened if the memory block including the desired word line is activated.

Figure 10:
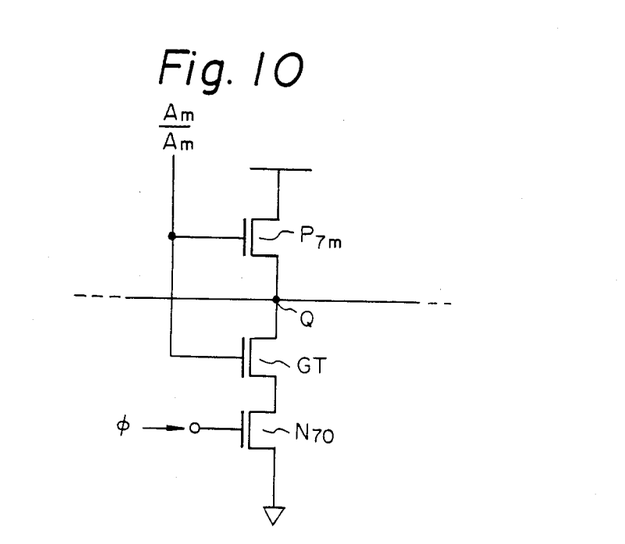
FIG. 10 is circuit diagram of a gate transistor shown in each of FIGS. 4 and 6, which is further provided with a gate.

FIG. 10 is a circuit diagram of the gate trnsistor $N_{70}$, shown in each of FIGS. 4 and 6, which is further connected to a gate. The gate GT is connected in series with the gate transistor $N_{70}$. Thus, the DC path is not created as long as the gate GT is opened. The gate GT is controlled so as to open or close by a signal. The signal is preferably the signal of the bit $A_m$ of the decoder inputs $A_{in}$. The logic "H" of the most significant bit (MSB) $A_m$ indicates that one half of the memory area is to be selected. Conversely, if the most significant bit is a logic "L", the MSB $A_m$ indicates that the other half thereof is to be selected. Accordingly, the power consumption due to the DC paths can be halved.

Figure 11:
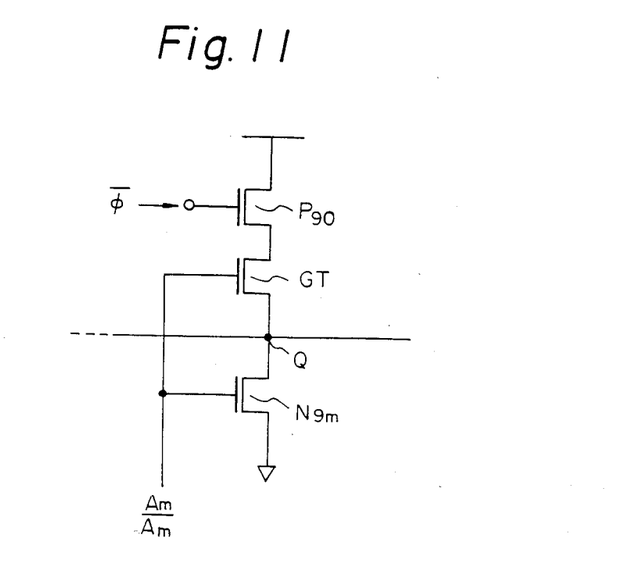
FIG. 11 is a circuit diagram of a gate transistor shown in each of FIGS. 7 and 8, which is further provided with a gate.

FIG. 11 is the gate transistor $P_{90}$ shown in each of FIGS. 7 and 8, which is further provided with a gate. The gate GT in FIG. 11 is identical to that of FIG. 10.

The number of the DC paths can be minimized by utilizing the outputs from the pre-decoder circuits PD shown in FIG. 3, instead of the MSB $A_m$. Regarding the pre-decoded outputs $X'_0$ through $X'_2$ (true to the outputs ($X'_4$ to $X'_7$) ... ($X'_k$ to $X'_{k+3}$)), the outputs $X'_0$ through $X'_3$ are applied to respective gates GT as on/off control signals. In this case, the gates GT are connected in series with the gate transistors receiving the pre-decoded outputs $X'_0$ through $X'_{k+3}$, respectively.

As explained above, the present invention allows realization of a decoder circuit with reduced size, higher density packaging, and higher operation speed. The above descriptions are made for example where a decoder circuit is applied to the semiconductor memory, however, it should be understood that the decoder circuit of the present invention is not limited only to such application only.

We claim:

1. A decoder circuit operatively connected to receive decoder input signals, specifying a selection state or a non-selection state, comprising:
    a gate pulse generator for generating a gate pulse having a first polarity and for detecting level changes occurring in any one or more bits of the decoder input signals;
    a plurality of input transistors having outputs, respectively, operatively connected to receive corresponding decoder input signals as control input signals, and operatively connected in parallel with each other, said input transistors including first channel type transistors;
    a node commonly connected to the outputs of said input transistors;
    a gate transistor, operatively connected to said node and operatively connected to receive the gate pulse as a control input, the gate pulse being generated every time a change in said decoder input signals takes place, said gate transistor momentarily inverting a level at said node upon receipt of the gate pulse when said decoder input signals change from those specifying the non-selection state to those specifying the selection state, said gate transistor being a second channel type transistor;
    a transistor latch, operatively connected to said node, for maintaining the level at said node and producing a decoder output signal; and
    a gate, operatively connected in series with said gate transistor, said gate opening or closing in dependence upon the logic of at least one bit of the decoder input signals.

2. A decoder circuit as set forth in claim 1, wherein said gate pulse generator is an address change detecting circuit.

3. A decoder circuit as set forth in claim 1, wherein said transistor latch comprises:
    a first CMOS structure transistor pair operatively connected to said node and having an input; and
    a second CMOS structure transistor pair, operatively connected to the input of said first CMOS structure transistor pair, an output of said second CMOS structure transistor pair being fed back to an input of said first CMOS structure pair which outputs the decoder output signal.

4. A decoder circuit as set forth in claim 1, wherein said transistor latch comprises:
    a CMOS structure transistor pair, operatively connected to said node for producing the decoder output signal, and having an output terminal; and
    a second channel type transistor, operatively connected to the output terminal of said CMOS structure transistor pair, the decoder output signal being branched and fed back to an input of said second channel type transistor.

5. A decoder circuit operatively connected to receive decoder input signals, specifying the selection state or a non-selection state, comprising:
    a gate pulse generator for producing an inverted output signal which functions as a gate pulse having a second polarity, and for detecting level changes occurring in one or more bits of the decoder input signals;
    a plurality of input transistors formed from second channel type transistors, having outputs, respectively, operatively connected to receive corresponding decoder input signals as control input signals, and operatively connected in parallel with each other;
    a node commonly connected to the outputs of said input transistors;
    a gate transistor formed from a first channel type transistor, operatively connected to said node and operatively connected to receive the gate pulse as a control input, the gate pulse being generated every time a change in said decoder input signals takes place, said gate transistor momentarily inverting a level at said node upon receipt of the gate pulse when the decoder input signals change from those specifying the non-selection state to those specifying the selection state;
    an inverter;
    a transistor latch, operatively connected to said node and having an output terminal operatively connected to said inverter, for maintaining the level at said node and producing a decoder output signal; and
    a gate, operatively connected in series with said gate transistor, said gate opening or closing in dependence upon the logic of at least one bit of the decoder input signals.

6. A decoder circuit as set forth in claim 5, wherein said gate pulse generator is an address change detecting circuit.

7. A decoder circuit as set forth in claim 5, wherein said transistor latch comprises:
    a first CMOS structure transistor pair operatively connected to said node, and having an input; and
    a second CMOS structure transistor pair operatively connected to the input of said first CMOS structure transistor pair and said inverter, an output from said second CMOS structure transistor pair being fed back to an input of said first CMOS structure transistor pair, and also applied to said inverter so as to produce the decoder output signal.

8. A decoder circuit as set forth in claim 5, wherein said transistor latch comprises:
    a CMOS structure transistor pair operatively connected to said inverter, and having an output terminal; and
    a second channel type transistor, operatively connected to the output terminal of said CMOS structure transistor pair, an output from said CMOS structure transistor pair being branched and fed back to an input of said second channel type transistor.

* * * * *

UNITED STATES PATENT AND TRADEMARK OFFICE
CERTIFICATE OF CORRECTION

PATENT NO. : 4,571,510
DATED     : FEBRUARY 18, 1986
INVENTOR(S) : TERUO SEKI ET AL.

It is certified that error appears in the above-identified patent and that said Letters Patent is hereby corrected as shown below:

FRONT PAGE [57] ABSTRACT, line 2, "ing" should be --es--.

Col. 3, line 48, "NHd 81" should be --$N_{81}$--;
       line 56, delete "speed" (first occurrence);
       line 61, delete ")" (first occurrence).

Col. 5, line 13, "$\phi$" should be --$\bar{\phi}$--(first occurrence);
       line 38, "($\phi$)" should be --($\bar{\phi}$)--.

Col. 6, line 5, delete ")" (first occurrence);
       line 15, delete ")" (first occurrence);
       line 33, ($\phi$, $\phi$)" should be --($\phi$, $\bar{\phi}$)--.

Col. 7, line 8, delete "only".

Signed and Sealed this

Third Day of June 1986

[SEAL]

Attest:

DONALD J. QUIGG

Attesting Officer

Commissioner of Patents and Trademarks